United States Patent [19]

Gregor et al.

[11] Patent Number: 5,312,781
[45] Date of Patent: May 17, 1994

[54] FLASH EEPROM FABRICATION PROCESS THAT USES A SELECTIVE WET CHEMICAL ETCH

[75] Inventors: Richard W. Gregor; Chung W. Leung, both of Allentown, Pa.

[73] Assignee: AT&T Bell Laboratories, Murray Hill, N.J.

[21] Appl. No.: 792,496

[22] Filed: Nov. 12, 1991

[51] Int. Cl.$^5$ .................... H01L 21/00; H01L 21/02; H01L 21/302; H01L 21/463
[52] U.S. Cl. .................... 437/235; 437/238; 437/240
[58] Field of Search .................... 437/235, 238, 240; 156/654, 657

[56] References Cited

U.S. PATENT DOCUMENTS 4,113,551  9/1978  Bassous et al. .................... 156/662
4,652,334  3/1987  Jain et al. .................... 156/657

*Primary Examiner*—William A. Powell
*Assistant Examiner*—B. Everhart
*Attorney, Agent, or Firm*—John T. Rehberg

[57] ABSTRACT

A method for wet etching disposable spacers in silicon integrated circuits is provided. Illustratively, a pair of spacers is formed over a polysilicon substrate. A second pair of spacers is formed from doped silicon dioxide over the first pair of spacers. Then the second pair of spacers is etched away with $NH_4OH/H_2O_2$, thus providing a means for defining the underlying polysilicon layer, e.g., by etching.

5 Claims, 1 Drawing Sheet

FLASH EEPROM FABRICATION PROCESS THAT USES A SELECTIVE WET CHEMICAL ETCH

TECHNICAL FIELD

This invention relates generally to methods for fabricating integrated circuits.

BACKGROUND OF THE INVENTION

In the fabrication of various EEPROM devices, it is frequently necessary to utilize etch processes with high selectivity. In particular, various gate structures (e.g., floating gate, control gate, erase gate) must typically be precisely defined by various etch processes without risk of damage to these gate structures. One process for floating gate definition involves the formation of two spacers, an undoped densified silicon dioxide spacer beneath a phosphorous doped silicon dioxide spacer. The phosphorous doped spacer is then removed by a wet etch after the gate is defined.

One etch process previously employed in FET fabrication utilizes a mixture of ammonium hydroxide and hydrogen peroxide, which is also called "ammonium peroxide" or $NH_4OH/H_2O_2$, to smooth a window opened in a composite dielectric comprising BPTEOS over TEOS on a crystalline silicon substrate. After the window is opened with dry etching procedures, thereby exposing bare crystalline silicon, the wafer is exposed to an ammonium peroxide cleaning solution to remove sodium or other contaminants from the surface of the BPTEOS. (The cleaning solution utilizes approximately eight parts $H_2O$, two parts $H_2O_2$ [30% concentrated] and one part concentrated $NH_4OH$.) It has been observed that the ammonium peroxide solution isotropically etches the BPTEOS somewhat and does not significantly etch the underlying TEOS or damage the crystalline silicon substrate.

SUMMARY OF THE INVENTION

The present invention provides a selective etch process suitable for defining floating gates. Illustratively, it includes forming a dielectric layer overlying a polysilicon substrate;

and wet etching said dielectric layer with $NH_4OH/H_2O_2$.

DETAILED DESCRIPTION

Figure 1:
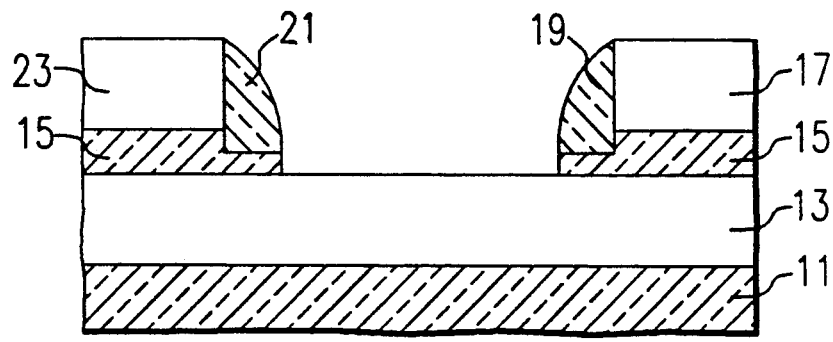
FIGS. 1-4 are cross-sectional views helpful in understanding the process of the present invention.

Turning to FIG. 1, reference numeral 11 denotes a thermal oxide layer which may be formed upon a substrate (not shown) such as silicon, doped silicon, epitaxial silicon, or another material. Reference numeral 13 denotes a polysilicon layer (which will eventually be partitioned by etching to form two separate floating gates and may also be considered a "substrate", if desired). In an exemplary embodiment, the polysilicon is in situ doped with 7% phosphorous and deposited at approximately 640° C. Other dopings and deposition temperatures may also be used. Reference numeral 15 denotes an oxide layer which has already been patterned. Reference numerals 17 and 23 denote portions of an already-patterned polysilicon layer and comprise portions of two control gates. Spacers 19 and 21 are formed by depositing a layer of TEOS and densifying the TEOS by raising the temperature of the wafer to in excess of 800° C. and then etching with an anisotropic RIE etch. (In practice, spacers 19 and 21 may be recessed somewhat in layer 15 as shown, although such recessing is not essential.)

Figure 2:
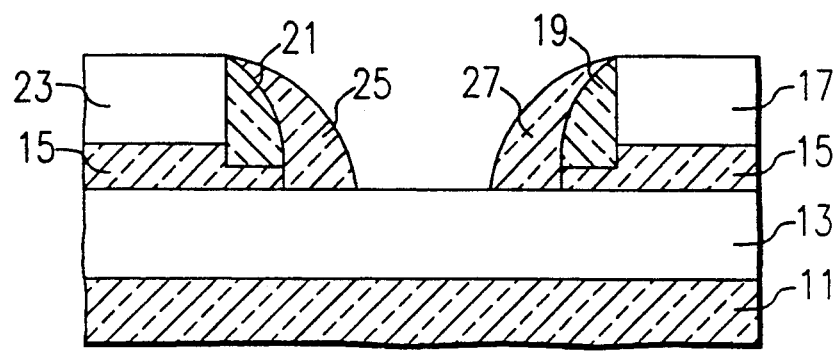

Turning to FIG. 2, a second pair of spacers 25 and 27 is formed by blanket depositing a layer of BPTEOS (doped with four percent by weight of boron and phosphorous). Other dopants and percentages may be used. The blanket layer of BPTEOS is anisotropically etched to produce spacers 25 and 27.

TEOS is an acronym for tetraethoxysilane (Si-$(OC_2H_5)_4$). Among those skilled in the art, the expression "depositing a layer of TEOS" is generally understood to mean the deposition of a dielectric layer by decomposition of a gas in a reactor. When TEOS is doped with boron and phosphorous, it is commonly termed "BPTEOS." The phosphorous and boron dopants may be obtained, for example, from trimethylphosphite, phosphine, trimethylborate, trimethylphosphate, triethylphosphite, or triethylphosphate. Typically, BPTEOS is deposited in a reactor at low pressure and temperatures of approximately 650° C. The TEOS and BPTEOS may also be deposited at lower temperatures using a plasma enhanced process.

Figure 3:
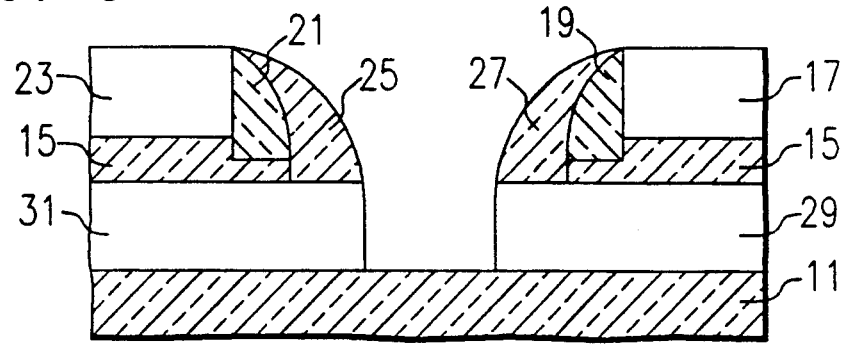

Turning to FIG. 3, it will be noted that spacers 25 and 27 have effectively served as a mask so that an anisotropic etching process may be used to sever polysilicon layer 13 (FIG. 1) into two portions 31 and 29 (FIG. 3).

Figure 4:
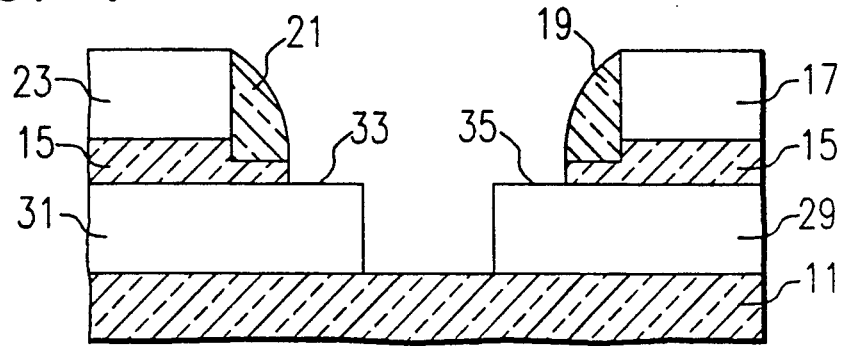

In FIG. 4, spacers 25 and 27 have been removed utilizing $NH_4OH/H_2O_2$. The use of $NH_4OH/H_2O_2$ is termed an "ammonium peroxide ("AP") clean." The preferred formula is eight parts $H_2O$, two parts $H_2O_2$ (30% concentrated), and one part concentrated $NH_4OH$. Successful use of the ammonium peroxide clean under these circumstances is unexpected. Usually ammonium peroxide solutions are employed to remove sodium or other contaminants from dielectric surfaces. Such solutions are not generally considered etchants for dielectrics. However, in the present application, ammonium peroxide works well to remove the BPTEOS spacer. Thus, applicants have found a highly selective method of removing the BPTEOS spacers without damaging the TEOS spacers. The process does not utilize the commonly used etchant HF. The process may also be effective with other materials which may be used for spacers 25 and 27 such as BPSG or plasma deposited BPTEOS.

Although an ammonium peroxide clean was employed previously (as mentioned before) to smooth BPTEOS over TEOS on an exposed crystalline silicon substrate, its successful use in the present application over polysilicon is unexpected because polysilicon is generally known to etch faster than crystalline silicon due to the greater number of incompletely bonded Si atoms. Also, grain boundaries and dislocations in polysilicon tend to promote faster chemical reaction.

Applicants' experiments have shown that the inventive etch process is superior to more conventional processes involving HF. Removal of spacers 25 and 27 is accomplished without damaging spacers 21 and 19 and without degrading surfaces 33 and 35 of now-defined floating gates 31 and 29.

The following Table 1 provides the etch rate ratios for the inventive solution (termed "AP") in contrast with standard HF solutions when the solution is applied to BPTEOS and TEOS, as well as BPTEOS and thermal silicon dioxide.

TABLE 1

ETCH RATE RATIO

| Materials | AP | HF 100:1 | HF* 15:1 | HF 30:1 | HF** buffered |
|---|---|---|---|---|---|
| BPTEOS/TEOS with TEOS (densified at 800° C.) | 11 | 1.3 | 1.8 | 0.3 | 0.2 |
| BPTEOS/Thermal SiO$_2$ | 725 | 6 | 7.5 | 0.6 | 0.5 |

*buffered HF utilizing 30NH$_4$F to 1 HF
**buffered HF utilizing 7NH$_4$F to 1 HF The ammonium peroxide solution should preferably be maintained at a temperature of 87°±3° C. for best results.

We claim:

1. A method of fabricating a semiconductor device comprising:
    forming a first dielectric layer of BPTEOS overlying polysilicon substrate;
    wet etching said first dielectric layer;
    CHARACTERIZED IN THAT said wet etching is accomplished with NH$_4$OH/H$_2$O$_2$.
2. The method of claim 1 in which a second dielectric is formed between said first dielectric and said substrate.
3. The method of claim 2 in which said second dielectric layer is TEOS.
4. The method of claim 1 in which said wet etching is carried out at a temperature of 87°±3° C.
5. The method of claim 2 in which said second dielectric layer comprises a first spacer and said first dielectric layer comprises a second spacer overlying said first spacer.

* * * * *